(12) United States Patent
Nevers et al.

(10) Patent No.: US 7,961,490 B2
(45) Date of Patent: Jun. 14, 2011

(54) GENERATING ROM BIT CELL ARRAYS (75) Inventors: Yannick Marc Nevers, Grenoble (FR); Vincent Philippe Schuppe, Austin, TX (US)

(73) Assignee: ARM Limited, Cambridge (GB)

( * ) Notice: Subject to any disclaimer, the term of this patent is extended or adjusted under 35 U.S.C. 154(b) by 175 days.

(21) Appl. No.: 12/318,863

(22) Filed: Jan. 9, 2009

(65) Prior Publication Data

US 2010/0177544 A1 Jul. 15, 2010

(51) Int. Cl.
*G11C 5/02* (2006.01)
(52) U.S. Cl. .............................. 365/51; 365/94; 365/104
(58) Field of Classification Search ................... 365/51, 365/94, 104
See application file for complete search history.

(56) References Cited

U.S. PATENT DOCUMENTS

| | | | |
|---|---|---|---|
| 5,812,461 A * | 9/1998 | Komarek et al. | 365/189.05 |
| 5,917,224 A | 6/1999 | Zangara | |
| 6,380,636 B1 * | 4/2002 | Tatsukawa et al. | 257/390 |
| 6,906,951 B2 * | 6/2005 | Wong | 365/185.03 |
| 6,920,058 B2 * | 7/2005 | Morikawa | 365/94 |
| 7,002,827 B1 | 2/2006 | Sabharwal et al. | |
| 7,436,690 B2 * | 10/2008 | Chen | 365/104 |

* cited by examiner

*Primary Examiner* — Pho M Luu
(74) *Attorney, Agent, or Firm* — Nixon & Vanderhye P.C.

(57) ABSTRACT

A method of generating a ROM bit cell array layout is provided, the method comprising the steps of: inputting a predetermined memory architecture having a predetermined positioning of bit lines and virtual ground lines, said memory architecture comprising a plurality of columns of memory cells, each column of memory cells being located between its own associated bit line and its own associated virtual ground line, and adjacent memory cells in each column of memory cells sharing a common connection to either said associated bit line or said associated virtual ground line; evaluating a possible range of width of active area of each of said columns of memory cells, in dependence on said predetermined positioning of bit lines and virtual ground lines; selecting a final width of active area in dependence on at least one performance characteristic associated with said final width of active area; and generating said ROM bit cell array layout according to said final width of active area. Thus the system designer can reuse an existing memory architecture, yet still retain an advantageous degree of flexibility with regard to performance characteristic selection of the final ROM bit cell array.

12 Claims, 12 Drawing Sheets

MOS transistor representation

Layout view:

Cross section view:

FIG. 12 (PRIOR ART)

GENERATING ROM BIT CELL ARRAYS

BACKGROUND OF THE INVENTION

1. Field of the Invention

The present invention relates to ROM bit cell arrays and methods of generating layouts for such ROM bit cell arrays.

2. Description of the Prior Art

High density ROM bit cell arrays composed of columns of bit cells have been achieved by implementing arrangements in which adjacent bit cells in the same column share a source/drain connection to an adjacent bit line or virtual ground line.

Figure 1:
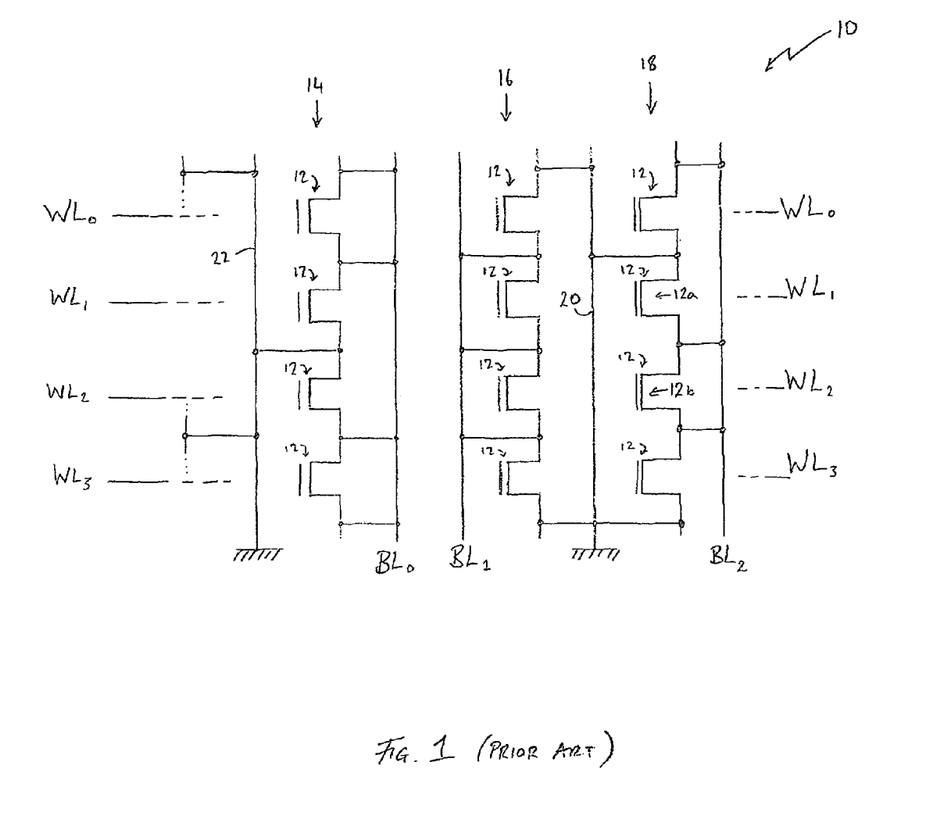
FIG. 1 illustrates a schematic diagram of a prior art ROM bit cell array.

In U.S. Pat. No. 5,917,224 a compact ROM matrix is disclosed in which two adjacent columns of bit cells share a virtual ground line. FIG. 1 schematically illustrates the arrangement disclosed. A ROM bit cell array 10 is composed of transistors 12 arranged in columns, of which only three (14, 16 and 18) are shown. A high density of cells is achieved in the vertical direction by virtue of adjacent bit cells in each column sharing source or drain (generically referred to herein as "drain") connections. These drain connections connect each transistor in each column to either a virtual ground line shared with an adjacent column of transistors or to a bit line uniquely associated with that particular column. For example the two transistors 12a and 12b illustrated in column 18 share a common drain connection to bit line $BL_2$. Transistor 12a shares a drain connection with the transistor above it to virtual ground line 20, whilst transistor 12b shares a drain connection with the transistor below it to bit line $BL_2$. Each transistor encodes a logical "0" or "1" by both its drain connections connecting to the same line (bit or virtual ground) or by one drain connection connecting to each kind of line. Thus when a particular bit line is charged (e.g. $BL_2$) and a particular word line enabled (e.g. $WL_1$), then the transistor located at the intersection of those lines (in this example transistor 12a) will manifest the logical "0" encoded by its drain connections by discharging bit line $BL_2$ onto virtual ground line 20. Conversely if word line WL2 were enabled instead (in order to read transistor 12b), no significant discharge of the bit line would occur (both drains of transistor 12b connect to the same line), indicating a logical "1" encoded by its drain connections (it will be understood that the encoding of "1" and "0" described above is merely a convention choice and could be trivially inverted). Columns 16 and 18 share virtual ground line 20, and have their own bit lines $BL_1$ and $BL_2$, respectively. Similarly column 14 shares virtual ground line 22 with the column of transistors to its left (not illustrated) and has its own dedicated bit line $BL_0$. The transistors 12 are switched in rows by word lines $WL_0$, $WL_1$, $WL_2$ and $WL_3$. For clarity the word lines are not fully illustrated.

Figure 2:
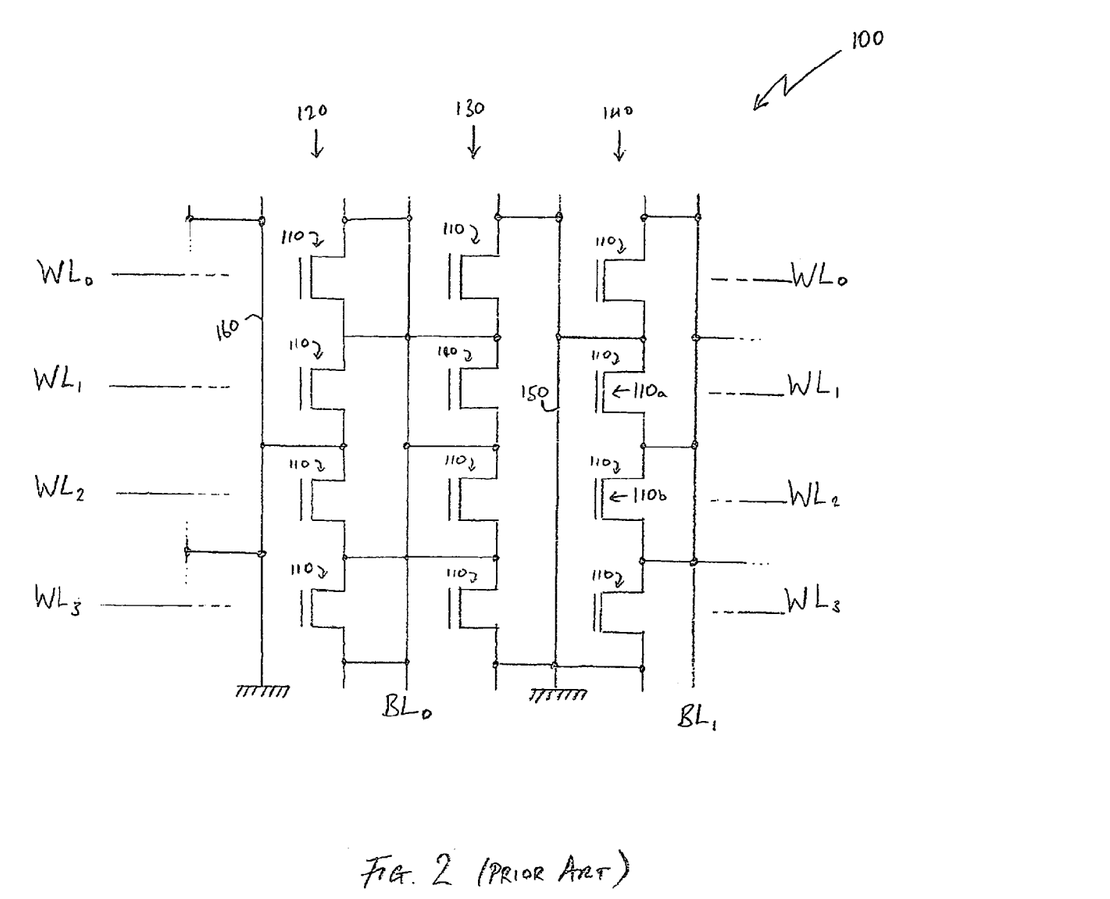
FIG. 2 illustrates a schematic diagram of another prior art ROM bit cell array.

In U.S. Pat. No. 7,002,827 a ROM array is disclosed in which a column of bit cells shares a virtual ground line with an adjacent column of bit cells on one side and shares a bit line with an adjacent column of bit cells on the other side. FIG. 2 schematically illustrates the arrangement disclosed. A ROM bit cell array 100 is composed of transistors 110 arranged in columns, of which only three (120, 130 and 140) are shown. As in the arrangement shown in FIG. 1, a high density of cells is achieved in the vertical direction by virtue of adjacent bit cells in each column sharing drain connections. In this arrangement a greater density in the horizontal direction is achieved by virtue of the fact that the drain connections connect each transistor in each column to either a virtual ground line shared with an adjacent column of transistors on one side or to a bit line shared with an adjacent column of transistors on the other side. For example the two transistors 110a and 110b illustrated in column 140 share a common drain connection to bit line $BL_1$. Transistor 110a shares a drain connection with the transistor above it to virtual ground line 150, whilst transistor 110b shares a drain connection with the transistor below it to bit line $BL_1$. The logical values encoded in each transistor by virtue of its drain connections are as described above with reference to FIG. 1. Columns 130 and 140 share virtual ground line 150 situated between them, whilst sharing a bit line with an adjacent column on their respective opposite sides. Hence column 130 shares bit line $BL_0$ with column 120 and column 140 shares bit line $BL_1$ with a column to its right (not illustrated). Similarly column 120 shares virtual ground line 160 with the column of transistors to its left (not illustrated). As in FIG. 1, word lines $WL_0$, $WL_1$, $WL_2$ and $WL_3$ are not fully illustrated for clarity.

The densities of bit cells achieved by the two prior art arrangements described above are not however without associated cost. For example, in the arrangement of U.S. Pat. No. 5,917,224 the coupling capacitance between the adjacent bit lines (e.g. $BL_0$ and $BL_1$) can be problematically high, especially for bit lines which have a large number of transistors connected thereto. On the other hand the arrangement of U.S. Pat. No. 7,002,827 for example requires more complex readout logic, to ensure that the measured discharge of a given bit line is caused by the bit cell intended to be read.

Figure 12:
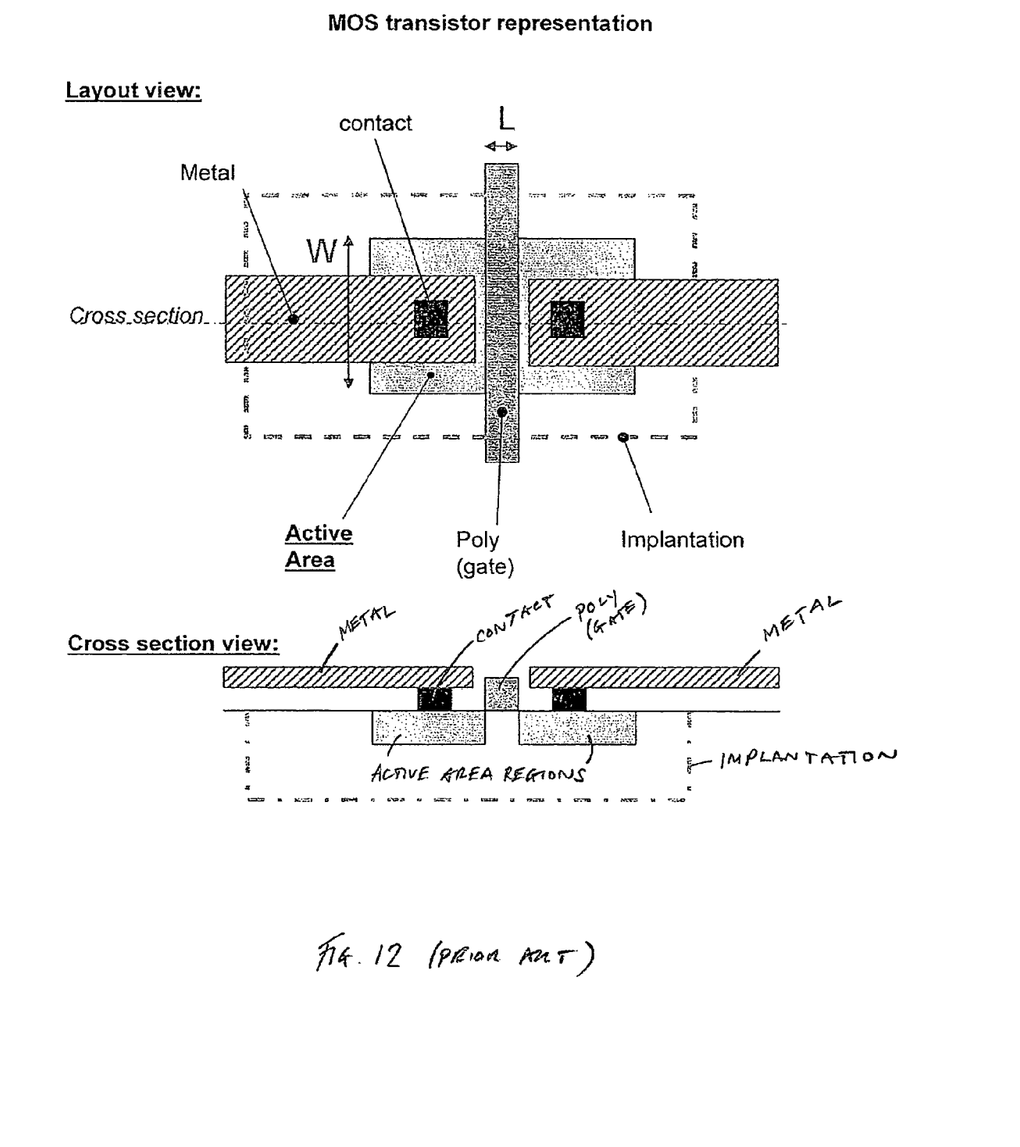
FIG. 12 is a block diagram illustrating the components of a prior art MOS transistor.

These highly compact ROM bit cell arrays enable a high density of bit cells to be arranged in a given area, in particular by virtue of having geometries that operate close to the diffusion limit i.e. the spacing between the active areas of the columns of bit cells cannot be reduced any further. In this context the active area of a bit cell will be understood to correspond at the mask level to the shape which is physically used to define the drains and channel of a MOS (metal-oxide-semiconductor) device. This can be seen from FIG. 12, representing a layout view and a cross-section view of a MOS transistor. The rectangle labelled "active area" (layout view) defines the area within which the active area is created, resulting in (cross-section view) two regions of active area (due to the poly (gate) having been deposited at an earlier stage of the process).

In addition, the creation of such high density ROM devices is a complex task, involving not only the layout of the bit cell array itself, but also the associated control circuitry, word line decoders and bit line decoders required to control and read out the bit cell array. Due to this complexity it is known for the creation process to re-use an existing arrangement of control circuitry, word line decoders and bit line decoders. The particular arrangement of bit cells in the bit cell array is then generated ("compiled") in accordance with specified requirements for that instance of ROM device. However the flexibility available to the system designer re-using control circuitry, word line decoders and bit line decoders in this manner is limited by the fact that an imposed constraint of reusing control circuitry is that the layout of word lines, bit lines and virtual ground lines is fixed (in order to correctly interface to the decoders). Furthermore, the additional constraints imposed by such high density ROM devices having geometries that operate close to the diffusion limit result in the flexibility afforded to the system designer in tuning the characteristics of the ROM bit cell array being still further limited.

It would be desirable to provide an improved technique for generating ROM bit cell arrays.

SUMMARY OF THE INVENTION

According to a first aspect, the present invention provides a method of generating a ROM bit cell array layout, the method comprising the steps of: inputting a predetermined memory architecture having a predetermined positioning of bit lines and virtual ground lines, said memory architecture comprising a plurality of columns of memory cells, each column of memory cells being located between its own associated bit line and its own associated virtual ground line, and adjacent memory cells in each column of memory cells sharing a common connection to either said associated bit line or said associated virtual ground line; evaluating a possible range of width of active area of each of said columns of memory cells, in dependence on said predetermined positioning of bit lines and virtual ground lines; selecting a final width of active area in dependence on at feast one performance characteristic associated with said final width of active area; and generating said ROM bit cell array layout according to said final width of active area.

Previously when generating a ROM bit cell array layout, re-using a predetermined memory architecture which has a predetermined positioning of bit lines and virtual ground lines has significantly constrained the flexibility available to the system designer. However, according to the techniques of the present invention, wherein the predetermined memory architecture comprises a plurality of columns of memory cells, each column of memory cells being located between its own associated bit line and its own associated virtual ground line, a bit cell array is provided which may be "metal constrained" in the horizontal direction, that is to say the spacing of the bit lines and virtual ground lines may be chosen to be at the technologically lower possible limit. Conversely the memory architecture of the present invention is not "diffusion constrained" in the horizontal direction as is the case in state of the art bit cell arrays. Although this consequently means that the horizontal dimension of a given bit cell (and hence of the entire bit cell array) is slightly increased with respect to the prior art, the inventors of the present invention have surprisingly found that for the price of a small trade off in bit cell density, a significant improvement in design flexibility may be afforded to the system designer when re-using predetermined memory architectures.

Since the memory architecture of the present invention is not diffusion constrained, the system designer may evaluate a possible range of width of active area of each of the columns of memory cells, in dependence on the predetermined positioning of the bit lines and virtual ground lines. The performance characteristics of a given bit cell array layout are dependent on the width of active area of each of the columns of memory cells, and the system designer can then select a final width of active area in dependence on at least one performance characteristic. The final ROM bit cell array layout is then generated according to the selected final width of active area. Thus, a high density ROM bit cell array layout, in which adjacent memory cells in each column of memory cells share a common connection to either an associated bit line or an associated virtual ground line, is provided whilst also giving the system designer advantageous flexibility with regard to tuning at least one performance characteristic of the final ROM bit cell array.

It will be appreciated that the step of selecting a final width of active area in dependence on at least one performance characteristic associated with the final width of active area could be carried out in a variety of ways. In one embodiment the selecting step comprises referencing a predetermined lookup table, the predetermined lookup table correlating the at least one performance characteristic with width of active area. This provides a simple and direct method of choosing a final width of active area on the basis of at least one associated performance characteristic. In another embodiment, the selecting step comprises choosing a candidate width of active area within the possible range; predicting the at least one performance characteristic in dependence on the candidate width; and adjusting the width of active area within the possible range to improve the at least one performance characteristic. This provides a method with at least one iterative step according to which it is possible to fine tune the selection of final width of active area in order to fine tune the at least one performance characteristic dependent thereon.

In one embodiment the final width of active area is selected in dependence on relative priorities of more than one performance characteristic associated with said final width of active area. Thus, different performance characteristics may be selected on the basis of the relative importance of those performance characteristics in the final ROM bit cell array.

In one embodiment each adjacent pair of columns of memory cells is arranged such that a bit line associated with one column of memory cells is adjacent to a virtual ground line associated with the other column of memory cells. By this arrangement the bit lines associated with two adjacent columns of memory cells are themselves not directly adjacent and indeed are shielded from one another by an intervening virtual ground line. This results in a significantly reduced coupling capacitance between the bit lines.

It will be appreciated by those skilled in the art that the at least one performance characteristic could be selected from a wide range of performance characteristics understood to be dependent on the selected final width of active area of each of the columns of memory cells. However, in one embodiment, the at least one performance characteristic is selected from: bit line capacitance; virtual ground line capacitance; speed of operation; power consumption; active area size; and current leakage. These example performance characteristics can represent significant features of a ROM bit cell array and hence it is advantageous that the system designer is nevertheless able to adjust at least one of these performance characteristics when reusing an existing memory architecture.

It will be appreciated that the memory cells could take a variety of forms. In one embodiment the memory cells comprise at least one NMOS transistor. In another embodiment the memory cells comprise at least one PMOS transistor.

Whilst the ROM bit cell array layout generated by the method according to the first aspect of the present invention could be generated in various ways, advantageously in one embodiment the ROM bit cell array layout is generated in a computer readable format. In one embodiment this computer readable format is gds2 (graphic data system 2) format, although it will be appreciated that other formats, e.g. OASIS, can be used.

According to a second aspect of the present invention, there is provided a ROM memory device comprising: a bit cell array comprising a plurality of columns of memory cells, each column of memory cells being located between its own associated bit line and its own associated virtual ground line, wherein adjacent memory cells in each column of memory cells share a common connection to either the associated bit line or the associated virtual ground line.

According to a third aspect of the present invention, there is provided a computer-readable storage medium storing a representation of a ROM bit cell array layout generated according to the method of the first aspect of the present invention.

According to a fourth aspect of the present invention, there is provided a computer-readable storage medium storing a representation of a ROM memory device according to the second aspect of the present invention.

According to a fifth aspect of the present invention, there is provided a system for generating a ROM bit cell array layout, the system comprising: an input for receiving a predetermined memory architecture having a predetermined positioning of bit lines and virtual ground lines, said memory architecture comprising a plurality of columns of memory cells, each column of memory cells being located between its own associated bit line and its own associated virtual ground line, and adjacent memory cells in each column of memory cells sharing a common connection to either said associated bit line or said associated virtual ground line; and processing logic for performing the steps of: evaluating a possible range of width of active area of each of said columns of memory cells, in dependence on said predetermined positioning of bit lines and virtual ground lines; selecting a final width of active area in dependence on at least one performance characteristic associated with said final width of active area; and generating said ROM bit cell array layout according to said final width of active area.

BRIEF DESCRIPTION OF THE DRAWINGS

The present invention will be described further, by way of example only, with reference to embodiments thereof as illustrated in the accompanying drawings, in which.

DESCRIPTION OF THE PREFERRED EMBODIMENTS

Figure 3:
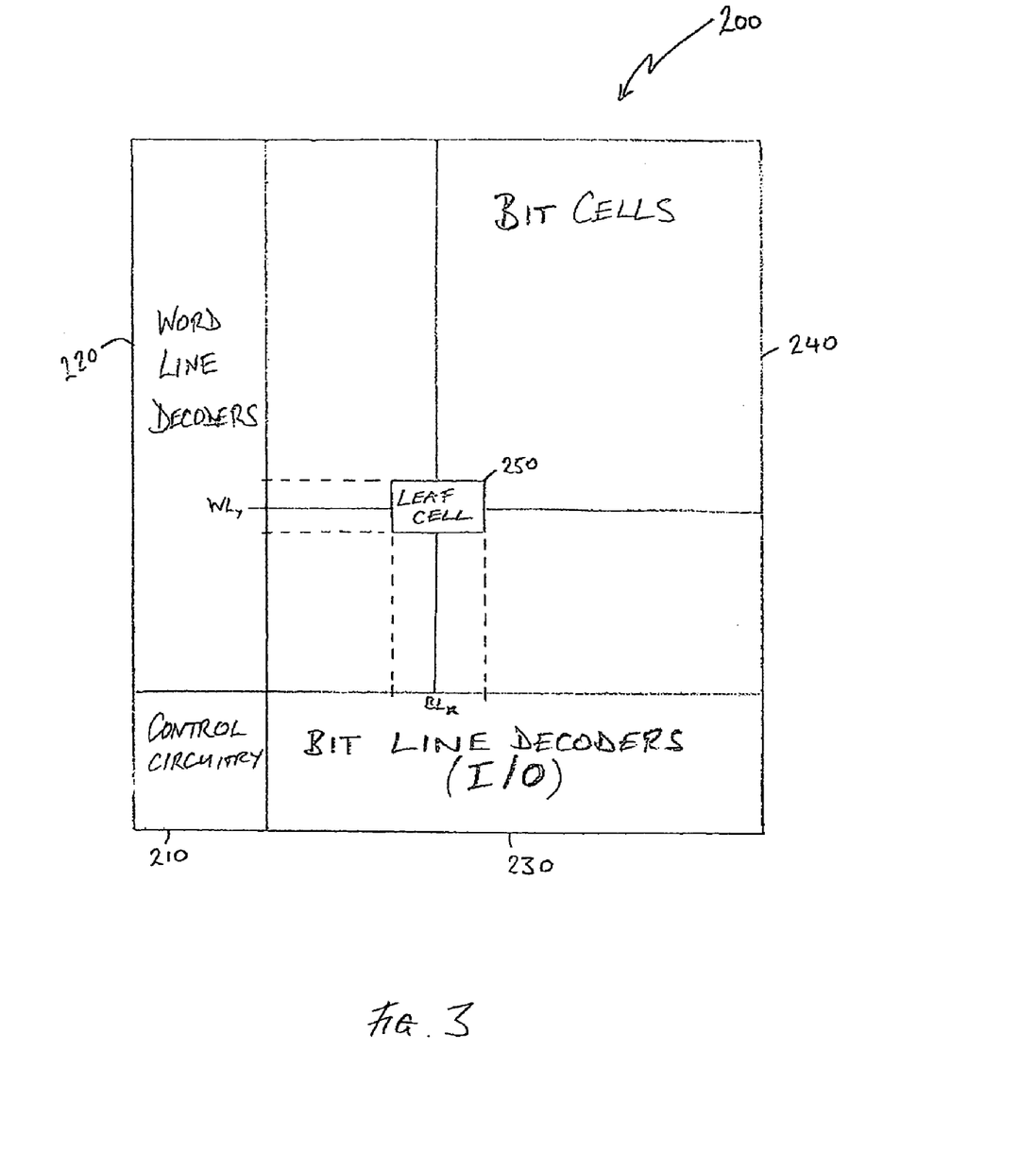
FIG. 3 schematically illustrates a ROM bit cell device including a bit cell array, word line decoders, bit line decoders and control circuitry.

FIG. 3 schematically illustrates the layout of an example ROM device 200 generated according to the techniques of the present invention. The ROM device 200 is controlled by control circuitry 210, which controls the operation of word line decoders 220 and bit line decoders 230. The operation of word line decoders 220 and bit line decoders 230 enables the logical values encoded in the array of bit cells (also referred to as memory cells) 240 to be read out. This reading out process involves selecting a particular word line by word line decoders 220 and reading out a particular bit line by bit line decoders 230 according to standard techniques and is not described in detail herein. Due to the complexity of devices such as ROM device 200, when a particular instance of such a ROM device is created ("compiled") by a system designer, it is often the case that an existing arrangement of control circuitry 210, word line decoders 220 and bit line decoders 230 are re-used and only the bit cell array 240 is re-defined according to the desired characteristics of the final ROM device. In a typical memory compiler this comprises arranging leaf cells (see example leaf cell 250) which themselves comprise a small array (e.g. 4×4) of bit cells. Due to the fact that word line decoders 220 and bit line decoders 230 are being re-used the positions of the word lines (e.g. word line $WL_Y$) and the bit lines (e.g. bit line $BL_X$) are predetermined and fixed. Nevertheless, according to the bit cell array arrangement of the present invention, significant design flexibility for the system designer remains, as will be further explained below. The final ROM bit cell array layout generated according to this method will in practice be typically output in the form of a computer readable representation, such as in gds2 format. The system designer can thus easily convey the final layout to the fabrication plant.

Figure 4:
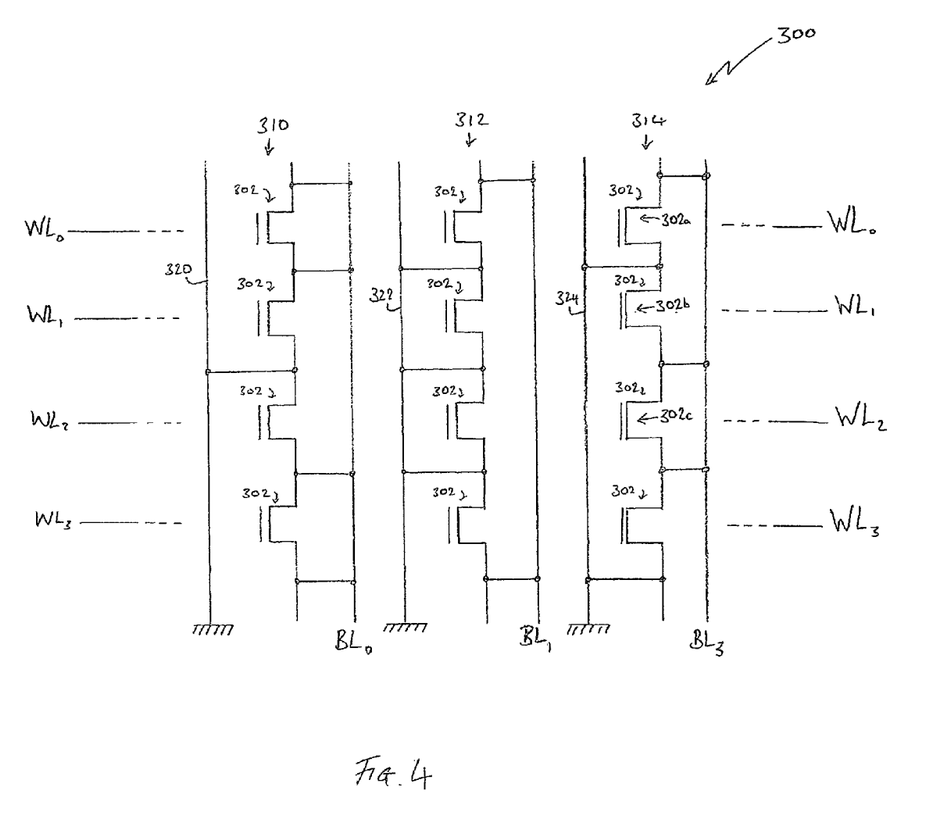
FIG. 4 illustrates a schematic diagram of a ROM bit cell array according to one embodiment of the present invention.

FIG. 4 illustrates a schematic illustration of a ROM bit cell array 300 according to one embodiment of the present invention. In this embodiment the memory cells comprise NMOS transistors 302, which are arranged in vertical columns of which only three—310, 312 and 314—are illustrated. In an alternative embodiment these could for example be PMOS transistors. Each column of transistors has its own associated virtual ground line and bit line, for example the column of transistors 310 is situated between virtual ground line 320 and bit line $BL_0$. In this embodiment, the virtual ground lines 320, 322 and 324 and the bit lines $BL_0$, $BL_1$ and $BL_3$ are arranged such that between the columns of transistors the bit line of one column is adjacent to the virtual ground line of the next column. In other embodiments it would be possible for two bit lines to be adjacent to one another and two virtual ground lines to be adjacent to one another, as would be the case in the example illustrated in FIG. 4 if virtual ground line 322 and bit line $BL_1$ were switched. However the arrangement illustrated in FIG. 4 with bit lines adjacent to virtual ground lines is preferred because of the shielding of the bit lines provided by the interposed virtual ground lines. Thus, in the arrangement shown the coupling capacitance between nearest bit lines is significantly reduced.

A relatively high density of ROM bit cells is achieved by virtue of the fact that adjacent transistors in a column share a drain connection to either the virtual ground line associated with that column or the bit line associated with that column. For example, transistor 302a shares a drain connection with transistor 302b to the virtual ground line 324. Transistor 302b shares a drain connection with transistor 302c to the bit line $BL_3$. The word lines $WL_0$, $WL_1$, $WL_2$ and $WL_3$ extend fully across the ROM bit cell array, but are not illustrated fully in FIG. 4 for clarity. Although the horizontal dimension of the bit cell array illustrated in FIG. 4 is slightly larger than that which is achievable when all virtual ground lines and bit lines are shared, the arrangement illustrated in FIG. 4 has been found to afford advantageous flexibility to the system designer when re-using bit cell array control circuitry and decoders (as discussed with reference to FIG. 3), as will be further explained in the following. In the bit cell array of FIG. 4 the encoding of logical "1" and "0" is standard and is not further described herein. Similarly the procedure for reading a particular bit cell of the ROM device by enabling a given word line and measuring the discharge on a particular bit line is also standard and is not described further herein.

Figure 5:
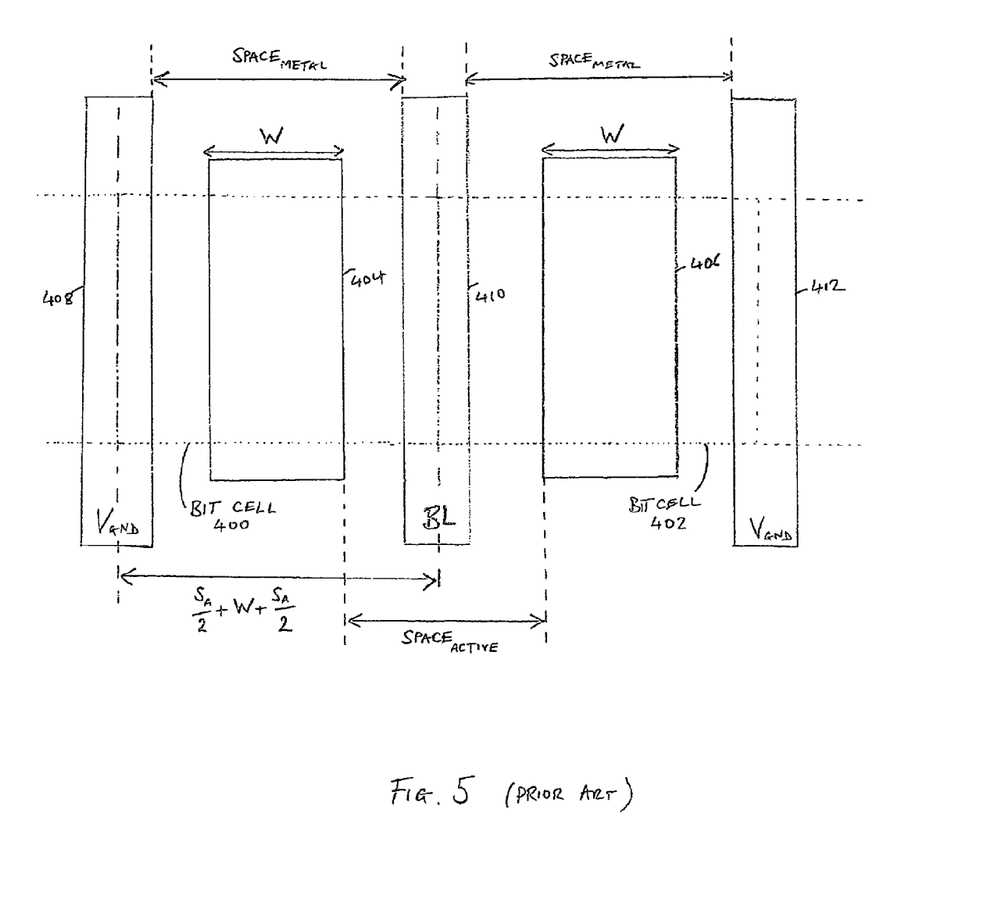
FIG. 5 schematically illustrates bit cell layout according to the prior art.
Figure 6:
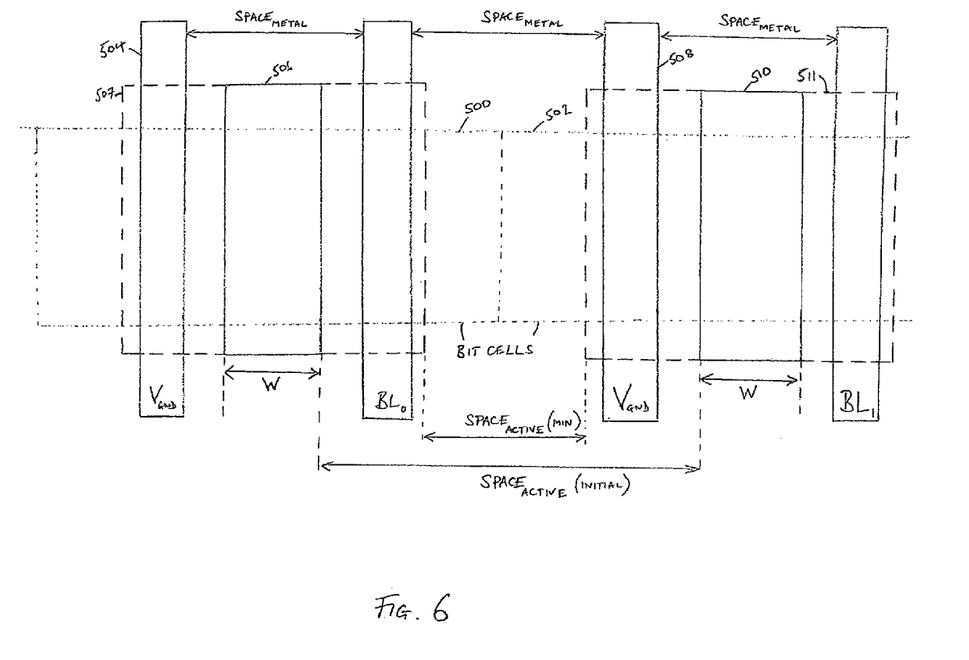
FIG. 6 schematically illustrates an example bit cell layout according to one embodiment of the present invention.

The advantages afforded to the system designer by the bit cell array arrangement introduced in FIG. 4 will be more apparent by the following discussion of FIGS. 5 and 6, which illustrate bit cell layouts according to the prior art and according to an embodiment of the present invention respectively. In FIGS. 5 and 6 only the bit cell components of relevance to the current discussion are illustrated (i.e. virtual ground lines, bit lines and bit cell active areas) and other components not relevant to the present discussion (e.g. word line layers and metal contacts) are not shown.

In FIG. 5 two horizontally adjacent bit cells 400 and 402 are illustrated according to an arrangement of bit cells such as that illustrated in FIG. 2. Each bit cell has an active area 404 and 406 respectively of width w and is delimited by a virtual ground line on one side and a bit line on the other side. For example bit cell 400 is bounded to the left by virtual ground line 408 and to the right by bit line 410. Similarly bit cell 402 is bounded by bit line 410 to the left and virtual ground line 412 to the right. The distance between a virtual ground line and a bit line is labelled as $SPACE_{METAL}$ and similarly the distance between adjacent active areas is labelled as $SPACE_{ACTIVE}$. Because of the desire to fit as great a density of bit cells as possible into a bit cell array the bit cells 400 and 402 will typically be constructed with $SPACE_{ACTIVE}$ set to be the technologically possible lower limit. At this point the bit cell is said to be diffusion constrained in the horizontal direction because if $SPACE_{ACTIVE}$ were to be any smaller then diffusion between active areas 404 and 406 would be too great for correct independent functioning of each cell. Indeed it may also be the case that $SPACE_{METAL}$ is also set to be the technologically lowest value possible in order to create as high a density of bit cells in the array as possible. Note that in FIG. 5 the active areas 404 and 406 are illustrated offset from the virtual ground lines 408 and 412 and the bit line 410. This is for purposes of clarity only and in reality a typical construction in which the various components of the bit cell are built up in layers (in the direction in and out of the page) would have the active areas overlapping the virtual ground lines and the bit lines. Thus arranged it can be seen that the horizontal dimension of the bit cell is given by $SPACE_{ACTIVE}/2+w+SPACE_{ACTIVE}/2$. Since this arrangement of bit cells is diffusion constrained (i.e. at the low limit of $SPACE_{ACTIVE}$), if the control circuitry and decoders of a ROM device are to be re-used (as described with reference to FIG. 3), then with the virtual ground lines and bit lines fixed in place (by virtue of the necessary interface to the word line and bit line decoders) then the system designer cannot increase the active area width w.

Turning to FIG. 6 a similar view is presented of the layout of two horizontally adjacent bit cells according to one embodiment of the present invention such as that illustrated in FIG. 3. On the left, bit cell 500 spans its dedicated virtual ground line 504 and its dedicated bit lines $BL_0$. Between this virtual ground line and bit line is the active area 506 of bit cell 500 which is illustrated having width w (like the width of active areas 404 and 406 in FIG. 5). The active area of bit cell 500 has an upper limit on its width (discussed below) illustrated by dashed line 507. Similarly, bit cell 502 spans virtual ground line 508 and bit line $BL_1$. Between virtual ground line 508 and bit line $BL_1$ active area 510 also has width w, and has an upper limit on its width illustrated by dashed line 511. In this embodiment, the bit cells are metal constrained in the horizontal direction, that is to say the distance between the virtual ground lines and bit lines ($SPACE_{METAL}$) is at minimum value that is technologically possible. By contrast these bit cells are not diffusion constrained in the horizontal direction, that is to say the distance between the active areas of horizontally adjacent cells is greater than the minimum value of $SPACE_{ACTIVE}$ that is technologically possible. Initially this distance is $SPACE_{ACTIVE}(INITIAL)$.

The particular advantage of this arrangement of bit cells is apparent when the process of re-using control circuitry, word line decoders and bit line decoders (as was discussed with reference to FIG. 3) is considered. The existing control circuitry and decoders predetermine the architectural arrangement of bit lines and virtual ground lines. However with the bit cell layout of the present invention, despite the fact that the positions of the bit lines and virtual ground lines are predetermined and fixed when re-using control circuitry and decoders, the system designer nevertheless has the flexibility to select the width of active area w in order to adjust the performance characteristics of the ROM device being produced. Thus, assuming that $SPACE_{ACTIVE}(INITIAL)$ corresponds to the arrangement when w is at the smallest value that is technologically possible, then the system designer may increase w (as illustrated by the dashed lines in FIG. 6) up to an upper limit of w when $SPACE_{ACTIVE}(MIN)$ is reached. A variety of performance characteristics of individual bit cells and hence full bit cell arrays depend on the width of the active area w of the bit cells and thus these performance characteristics of the final bit cell array can be chosen by the system designer.

Figure 7:
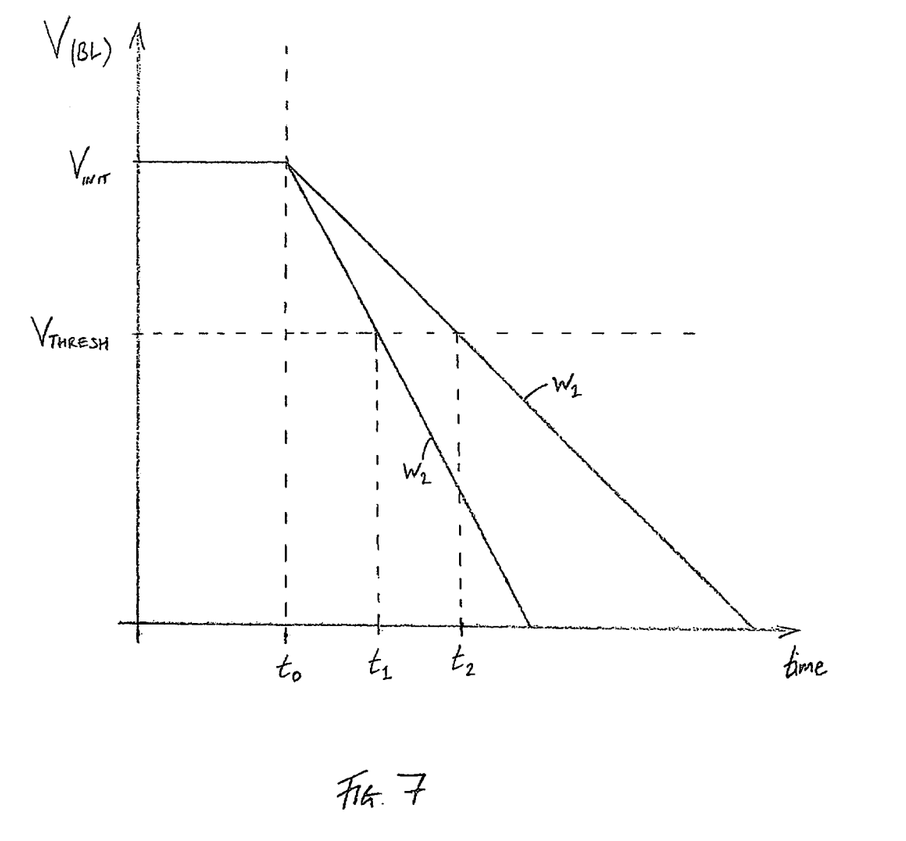
FIG. 7 schematically illustrates a variation in an example performance characteristic with width of active area.

FIG. 7 schematically illustrates one such performance characteristic varying in dependence on the chosen active area width w. The graph in FIG. 7 illustrates the discharge of a bit line voltage depending on the width (w) of bit cell transistor. In the example shown a bit cell is being read out which has encoded a logical value "0" by having one drain connection to the virtual ground line and one drain connection to the bit line. Thus when the word line corresponding to this bit cell is enabled the bit line discharges. This discharge is shown in the graphic by the initial voltage $V_{INIT}$ falling to a threshold value $V_{THRESH}$ which represents the boundary for interpreting the bit line discharge as resulting from a logical value "0" being stored in the corresponding bit cell. It is known that the speed with which the bit line discharges is dependent on the width of active area of the bit cell being read and in the example of FIG. 7 an active area width $w_1$ is less than an active area width $w_2$ resulting in a faster bit line discharge for the wider active area. Thus the time taken for the threshold voltage reading $V_{THRESH}$ to be reached is shorter for the wider active area. Whilst this example performance characteristic of bit line discharge speed has been discussed it will be recognized by those skilled in the art that many performance characteristics of individual bit cells and bit cell arrays are dependent on the width w of the active area of the bit cells such as bit line capacitance, virtual ground line capacitance, power consumption, active area size and current leakage. Depending on the relative priority of these performance characteristics the system designer can select w to produce a bit cell array as desired.

Figure 8:
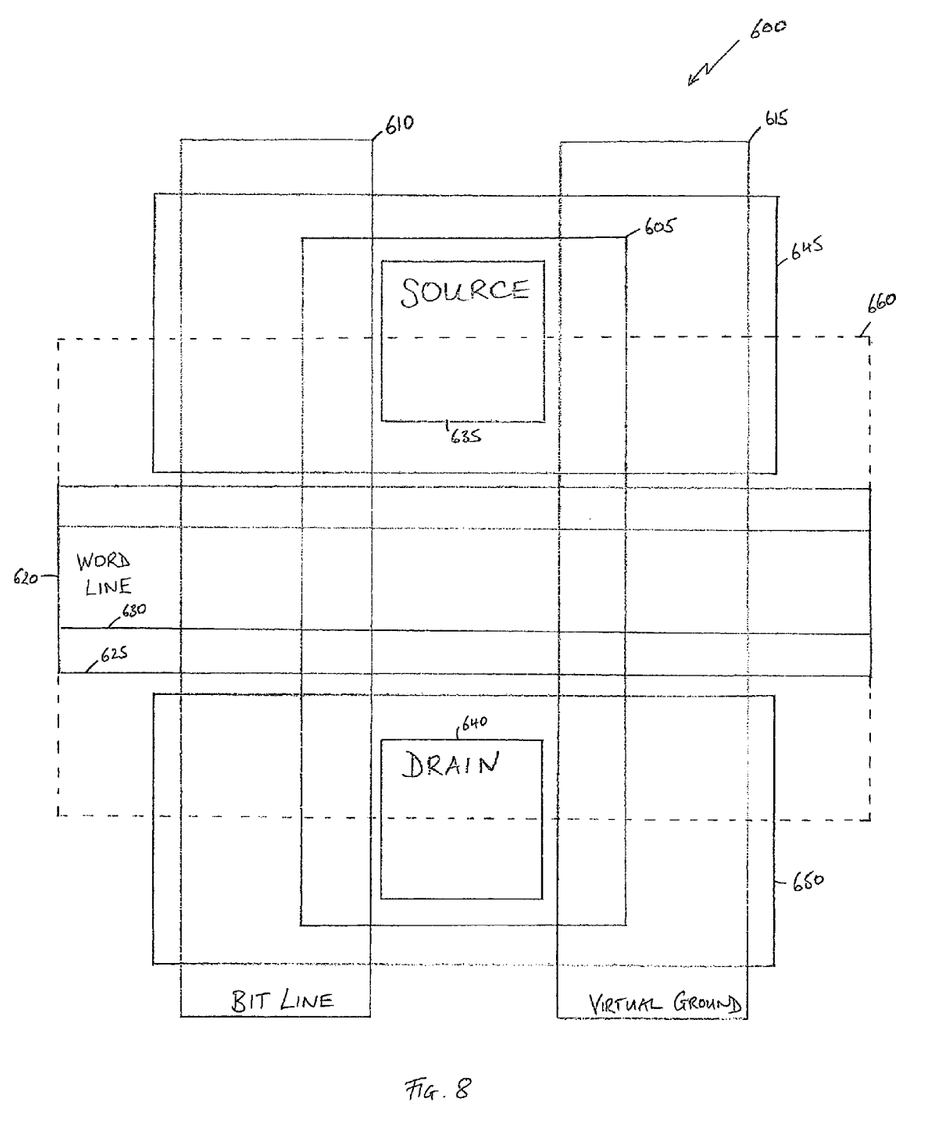
FIG. 8 schematically illustrates an example bit cell layout according to one embodiment of the present invention.

FIG. 8 schematically illustrates a bit cell layout in accordance with one embodiment of the present invention giving more realistic relative dimensions of various components. Bit cell 600 is composed of an active area 605, a bit line 610, a virtual ground line 615 and a word line 620. Word line 620 comprises two layers, a metal layer 625 and a poly layer 630. The two squares 635 and 640 are contacts which connect the active layer 605 to the upper metal layers 645 and 650. Upper metal layers 645 and 650 are provided such that connections can be formed by vias between either the bit line or the virtual ground and the source or drain. The dashed line 660 is the nominal edge of the bit cell representing the boundary of the unit that is tiled when the system designer arranges multiple bit cells in a bit cell array layout.

Figure 9:
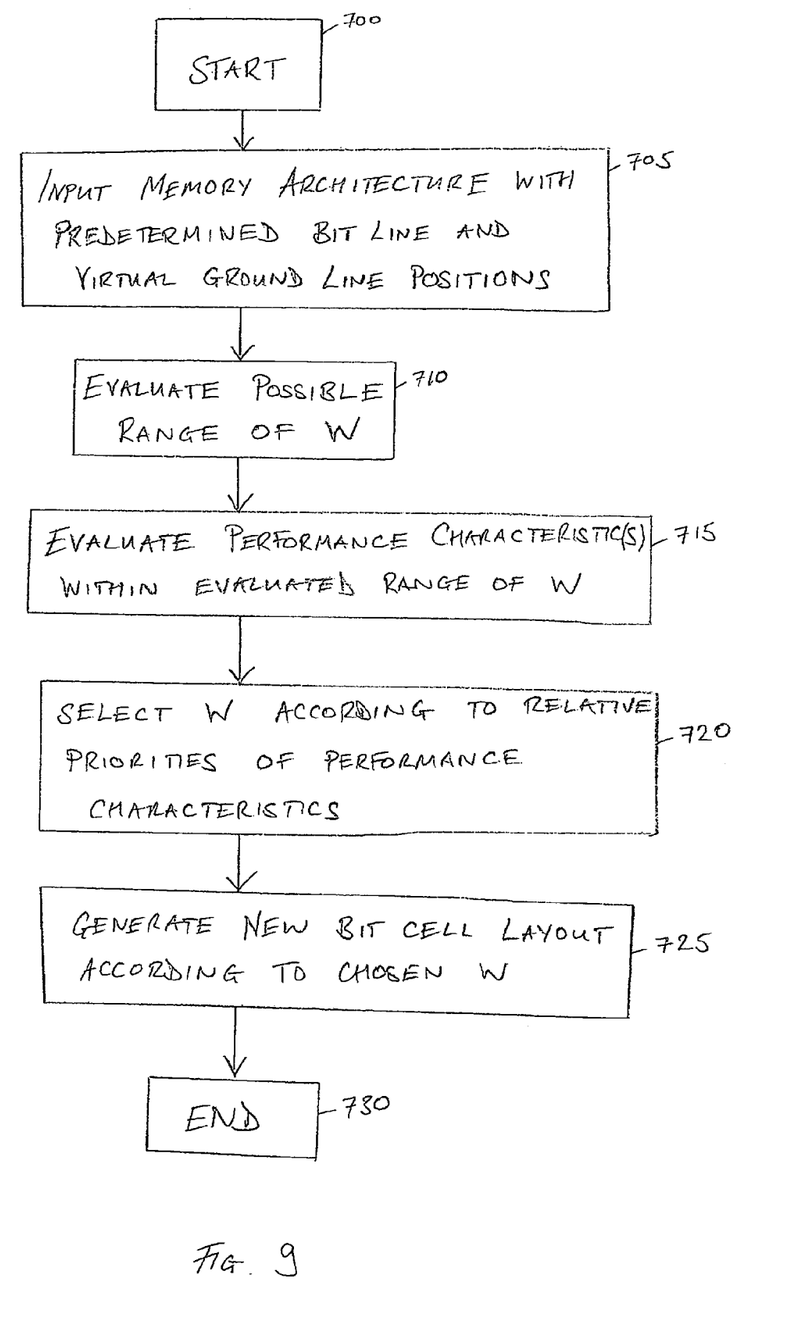
FIG. 9 is a flow diagram illustrating example steps taken according to one embodiment of the present invention.

FIG. 9 is a flow diagram illustrating the steps taken in a process according to one embodiment of the present invention. The flow starts at start 700 and proceeds to step 705 where a memory architecture with predetermined bit line and virtual ground line positions is input. Then, on the basis of this memory architecture, at step 710 the possible range of widths of active area w is evaluated. On the basis of this evaluated range of w at step 715 at least one performance characteristic is evaluated corresponding to that evaluated range of w. Then at step 720 a value of w is chosen according to the relative priorities of the performance characteristics corresponding to that choice of w and at step 725 a new bit cell layout according to the chosen w is generated. The flow ends at step 730.

Figure 10:
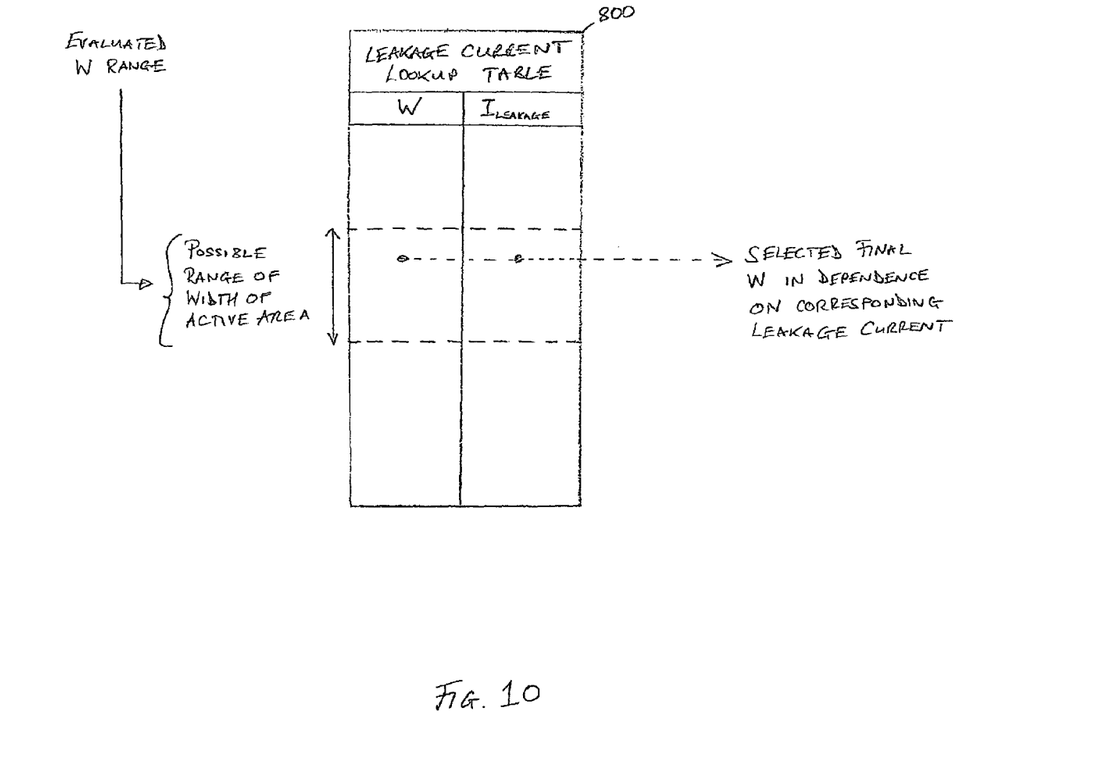
FIG. 10 schematically illustrates correlating a possible range of width of active area with an example performance characteristic.

An example of selecting a final value of w in dependence on an evaluated possible range of width of active area is illustrated in FIG. 10. FIG. 10 schematically illustrates a leakage current lookup table. The leakage current of a bit cell is known to depend on the width of active area w. Leakage current lookup table 800 correlates predetermined predictions for leakage current listed against a range of values of w. Once the possible range of w has been evaluated in dependence on the predetermined bit line and virtual ground line positions of the memory architecture, this range of w can be correlated to a corresponding range of leakage current. The system designer can then determine what an acceptable leakage current is from lookup table 800 and select a final value of w dependent thereon. In an alternative embodiment the method of selecting the final value of w is comprises selecting a candidate value of w, predicting a performance characteristic in dependence thereon (for example by referencing a look up table, by calculation from first principles, etc.) and then adjusting the width of active area (within the constraints of the evaluated possible range) to improve that performance characteristic. This latter method can become iterative by re-predicting the performance characteristic on the basis of the adjusted width of active area.

Figure 11:
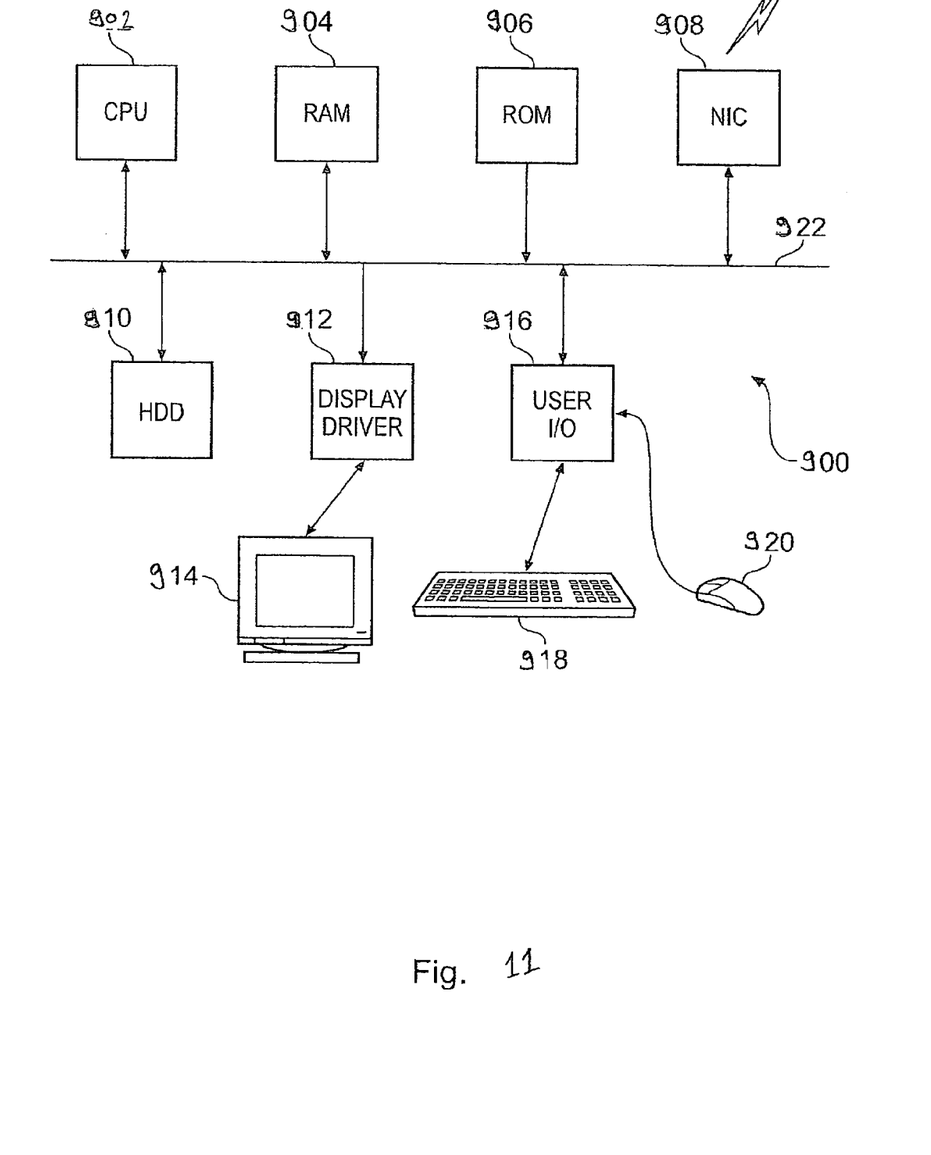
FIG. 11 is a diagram of a computer system on which the generation methods of embodiments of the present invention may be performed.

FIG. 11 schematically illustrates a general purpose computer 900 of the type that may be used to implement the above described ROM bit cell array generation techniques. The general purpose computer 900 includes a central processing unit 902, a random access memory 904, a read only memory 906, a network interface card 908, a hard disk drive 910, a display driver 912 and monitor 914 and a user input/output circuit 916 with a keyboard 918 and mouse 920 all connected via a common bus 922. In operation the central processing unit 902 will execute computer program instructions that may be stored in one or more of the random access memory 904, the read only memory 906 and the hard disk drive 910 or dynamically downloaded via the network interface card 908. The results of the processing performed may be displayed to a user via the display driver 912 and the monitor 914. User inputs for controlling the operation of the general purpose computer 900 may be received via the user input output circuit 916 from the keyboard 918 or the mouse 920 (and hence for example the selection of final width of active area can be entered via this mechanism). It will be appreciated that the computer program could be written in a variety of different computer languages. The computer program may be stored and distributed on a recording medium or dynamically downloaded to the general purpose computer 900. When operating under control of an appropriate computer program, the general purpose computer 900 can perform the above described ROM bit cell array generation techniques and can be considered to form an apparatus for performing the above described techniques. The architecture of the general purpose computer 900 could vary considerably and FIG. 11 is only one example.

Thus the present invention provides a method of generating a ROM bit cell array layout, which despite reusing an existing memory architecture provides the system designer with advantageous flexibility regarding the selection and fine-tuning of performance characteristics of the final ROM device having the generate bit cell array layout.

Although particular embodiments of the invention have been described herein, it will be apparent that the invention is not limited thereto, and that many modifications and additions may be made within the scope of the invention. For example, various combinations of the features of the following dependent could be made with the features of the independent claims without departing from the scope of the present invention.

We claim:

1. A method of generating a ROM bit cell array layout, the method comprising the steps of:
    inputting a predetermined memory architecture having a predetermined positioning of bit lines and virtual ground lines, said memory architecture comprising a plurality of columns of memory cells, each column of memory cells being located between its own associated bit line and its own associated virtual ground line, and adjacent memory cells in each column of memory cells sharing a common connection to either said associated bit line or said associated virtual ground line;
    evaluating a possible range of width of active area of each of said columns of memory cells, in dependence on said predetermined positioning of bit lines and virtual ground lines;
    selecting a final width of active area in dependence on at least one performance characteristic associated with said final width of active area; and
    generating said ROM bit cell array layout according to said final width of active area.

2. The method as claimed in claim 1, wherein said selecting step comprises:
    referencing a predetermined lookup table, the predetermined lookup table correlating said at least one performance characteristic with width of active area.

3. The method as claimed in claim 1, wherein said selecting step comprises:
    choosing a candidate width of active area within said possible range;
    predicting said at least one performance characteristic in dependence on said candidate width;
    adjusting said width of active area within said possible range to improve the at least one performance characteristic.

4. The method as claimed in claim 1, wherein the final width of active area is selected in dependence on relative priorities of more than one performance characteristic associated with said final width of active area.

5. The method as claimed in claim 1, wherein each adjacent pair of columns of memory cells is arranged such that a bit line associated with one column of memory cells is adjacent to a virtual ground line associated with the other column of memory cells.

6. The method as claimed in claim 1, wherein said at least one performance characteristic is selected from:
    bit line capacitance;
    virtual ground line capacitance;
    speed of operation;
    power consumption;
    active area size; and
    current leakage.

7. The method as claimed in claim 1, wherein said memory cells comprise at least one NMOS transistor.

8. The method as claimed in claim 1, wherein said memory cells comprise at least one PMOS transistor.

9. The method as claimed in claim 1, wherein said ROM bit cell array layout is generated in a computer-readable format.

10. The method as claimed in claim 9, wherein said computer-readable format is gds2 format.

11. A computer-readable storage medium storing a representation of a ROM bit cell array layout generated according to the method of claim 1.

12. A system for generating a ROM bit cell array layout, the system comprising:
 an input for receiving a predetermined memory architecture having a predetermined positioning of bit lines and virtual ground lines, said memory architecture comprising a plurality of columns of memory cells, each column of memory cells being located between its own associated bit line and its own associated virtual ground line, and adjacent memory cells in each column of memory cells sharing a common connection to either said associated bit line or said associated virtual ground line; and
 processing logic for performing the steps of:
 evaluating a possible range of width of active area of each of said columns of memory cells, in dependence on said predetermined positioning of bit lines and virtual ground lines;
 selecting a final width of active area in dependence on at least one performance characteristic associated with said final width of active area; and
 generating said ROM bit cell array layout according to said final width of active area.

\* \* \* \* \*